(12) United States Patent
Smith et al.

(10) Patent No.: US 10,702,866 B2
(45) Date of Patent: Jul. 7, 2020

(54) LAYERED SILICON AND STACKING OF MICROFLUIDIC CHIPS

(71) Applicant: International Business Machines Corporation, Armonk, NY (US)

(72) Inventors: Joshua T. Smith, Croton on Hudson, NY (US); Cornelia Tsang Yang, Medford, MA (US); Benjamin H. Wunsch, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 580 days.

(21) Appl. No.: 15/434,043

(22) Filed: Feb. 15, 2017

(65) Prior Publication Data
US 2018/0229235 A1 Aug. 16, 2018

(51) Int. Cl.
*B01L 3/00* (2006.01)
*B81C 1/00* (2006.01)

(52) U.S. Cl.
CPC ... *B01L 3/502707* (2013.01); *B01L 3/502761* (2013.01); *B81C 1/00119* (2013.01);
(Continued)

(58) Field of Classification Search
CPC ......... B81C 1/00119; B81C 2201/0194; B81C 2203/036; B81C 2201/0132;
(Continued)

(56) References Cited

U.S. PATENT DOCUMENTS

| 7,351,603 B2 | 4/2008 | Sparks et al. |
| 7,381,628 B2 | 6/2008 | Sparks et al. |

(Continued)

FOREIGN PATENT DOCUMENTS

| CN | 103824813 A | 5/2014 |
| EP | 1248949 | 5/2013 |

(Continued)

OTHER PUBLICATIONS

J. Cooper McDonald et al., "Fabrication of microfluidic systems in poly(dimethylsiloxane)," Electrophoresis 2000, 21, pp. 27-40.
(Continued)

*Primary Examiner* — Samuel P Siefke
(74) *Attorney, Agent, or Firm* — L. Jeffrey Kelly, Esq.; Hoffmann & Baron, LLP

(57) ABSTRACT

An apparatus for sorting macromolecules includes a first chip including a channel formed in a first side of the first chip and having at least one monolithic sorting structure for sorting macromolecules from the sample fluid. A first set of vias formed in the first chip has openings in a second side of the first chip, the sample fluid being provided to the sorting structure through the first set of vias. A second set of vias formed in the first chip has openings in the second side for receiving macromolecules in the sample fluid greater than or equal to a prescribed dimension sorted by the sorting structure. A third set of vias formed in the first chip has openings in the second side for receiving macromolecules in the sample fluid less than the prescribed dimension. The apparatus includes first and second seals covering the first and second sides, respectively.

15 Claims, 5 Drawing Sheets

(52) U.S. Cl.
CPC ............ B01L 2200/0631 (2013.01); B01L 2200/0652 (2013.01); B01L 2200/12 (2013.01); B01L 2300/0816 (2013.01); B01L 2300/0887 (2013.01); B01L 2300/12 (2013.01); B81B 2201/058 (2013.01); B81C 2201/0132 (2013.01); B81C 2201/0194 (2013.01); B81C 2203/036 (2013.01)

(58) Field of Classification Search
CPC ..... B01L 2300/0816; B01L 2300/0887; B01L 2200/0652; B01L 3/502707; B01L 3/502761; B01L 2300/12; B01L 2200/0631; B01L 2200/12; B81B 2201/058
See application file for complete search history.

(56) References Cited

U.S. PATENT DOCUMENTS

| | | | |
|---|---|---|---|
| 8,512,559 B2 | 8/2013 | Ramanathan et al. | |
| 8,992,859 B2 | 3/2015 | Sparks et al. | |
| 2002/0185183 A1* | 12/2002 | O'Connor | B01F 5/064 |
| | | | 137/814 |
| 2008/0023399 A1* | 1/2008 | Inglis | B01L 3/502753 |
| | | | 210/649 |
| 2013/0243656 A1 | 9/2013 | Chan et al. | |
| 2014/0008281 A1 | 1/2014 | Ramanathan et al. | |
| 2015/0004627 A1 | 1/2015 | Wu et al. | |

FOREIGN PATENT DOCUMENTS

| | | |
|---|---|---|
| EP | 2902104 A1 | 5/2015 |
| KR | 101287445 | 7/2013 |
| WO | 01/53819 A1 | 7/2001 |
| WO | 2012098349 A1 | 7/2012 |

OTHER PUBLICATIONS

Zhi-Jian Jia et al., "Bonding of Glass Microfluidic Chips at Room Temperatures," Analytical Chemistry, vol. 76, No. 18, Sep. 15, 2004, pp. 5597-5602.

J. McGrath et al., "Deterministic lateral displacement for particle separation: a review," Lab Chip, 2014, 14, pp. 4139-4158.

Bing Dang et al., "Integrated Thermal-Fluidic I/O Interconnects for an On-Chip Microchannel Heat Sink," IEEE Electron Device Letters, vol. 27, No. 2, Feb. 2009, pp. 117-119.

C.R. King, Jr. et al., "3D Stacking of Chips with Electrical and Microfluidic I/O Interconnects," Electronic Components and Technology Conference, 2008, pp. 1-7.

S.K. Mitra et al., "Microfluidics and Nanofluidics Handbook: Fabrication, Implementation, and Applications," CRC Press, Ch. 10.2.2.3, Sep. 2011, p. 298.

* cited by examiner

//LAYERED SILICON AND STACKING OF MICROFLUIDIC CHIPS

BACKGROUND OF THE INVENTION

The present invention relates generally to microfluidics, and more particularly to silicon-based techniques for separating or sorting macromolecules from a sample fluid.

Separating and sorting biological entities, such as cells, proteins, and DNA, is critical to a vast number of biomedical applications, including diagnostics, therapeutics, cell biology, and proteomics. Gel electrophoresis is widely employed for separating macromolecules, such as DNA, RNA, proteins, and their fragments, and in the medical diagnostics field represents a multi-billion-dollar market.

In gel electrophoresis separation of protein and DNA/RNA for analytical purposes, a protein mix is usually subjected to a strong electric field, typically about 30 V/cm. Proteins or DNA/RNA move through the gel at a rate depending upon their size and surface charge. However, there are several disadvantages to gel electrophoresis. The gels are prepared from agarose or acrylamide polymers that are known to be toxic, and the outcome of electrophoresis is revealed optically by staining the proteins with dye or the DNA/RNA with ethidium bromide, which is extremely cancerogenic. Gels require sufficient quantities of material for the outcome of the electrophoresis to be detectable, but poor cross-linking in the gel matrix often leads to inconclusive results and a complete loss of the samples. If the gel matrix size is not adapted to the sample molecule size or if the electrophoresis runs too long, then samples may be lost.

Syringe-based filters also provide another option to filter material down to a size of tens of nanometers. However, such filters rapidly clog and are very unreliable for separating macromolecules at such scale. In comparison to traditional techniques, silicon (Si) nano-fabrication technology can offer precise and accurate control in the dimensioning and positioning of nano-structures, which can lead to reliable sorting of particles based upon their size. To date, silicon-based lab-on-a-chip approaches using Si and pillar arrays have shown promise in sorting material down to the range of DNA, exosomes, and viruses. However, the volumes that such chips can process are relatively small due to the in-plane arrangement of their structures, and consequently their applications are usually limited to analytic solutions.

BRIEF SUMMARY

Principles of the invention, in accordance with one or more embodiments thereof, provide apparatus and methods for layered stacking of silicon-based microfluidic chips.

In accordance with one embodiment of the invention, an apparatus for sorting macromolecules in a sample fluid includes a first chip having a front side and a backside. The first chip includes at least first, second and third reservoirs formed in the front side of the first chip, the first reservoir being configured to hold the sample fluid. The apparatus further includes a second chip supported on the first chip. The second chip includes a channel having at least one monolithic sorting structure configured to sort macromolecules from the sample fluid. A first set of vias formed in the second chip is configured to couple the channel to the first reservoir, the first set of vias providing the sample fluid from the first reservoir to the monolithic sorting structure for sorting. A second set of vias formed in the second chip is configured to couple the channel to the second reservoir. A third set of vias formed in the second chip is configured to couple the channel to the third reservoir. A fourth set of vias formed in the first chip has respective openings in the backside of the first chip and is configured as an inlet to the first reservoir. A fifth set of vias formed in the first chip has respective openings in the backside of the first chip and is configured as an outlet for the second reservoir. A sixth set of vias formed in the first chip has respective openings in the backside of the first chip and is configured as an outlet for the third reservoir.

In accordance with another embodiment of the invention, an apparatus for sorting macromolecules in a sample fluid includes a first chip comprising a channel formed in a first side of the first chip and having at least one monolithic sorting structure configured to sort macromolecules from the sample fluid. A first set of vias formed in the first chip has respective openings in a second side of the first chip opposite the first side, the sample fluid being provided to the monolithic sorting structure through the first set of vias. A second set of vias formed in the first chip has respective openings in the second side of the first chip and is configured for receiving macromolecules in the sample fluid greater than or equal to a prescribed dimension sorted by the monolithic sorting structure. A third set of vias formed in the first chip has respective openings in the second side of the first chip and is configured for receiving macromolecules in the sample fluid less than the prescribed dimension sorted by the monolithic sorting structure. The apparatus further includes first and second seals covering the first and second sides, respectively, of the first chip.

In accordance with yet another embodiment of the invention, a method includes: forming at least first, second and third reservoirs in a front side of a first chip, the first reservoir being configured to hold a sample fluid containing macromolecules; forming a channel in a second chip, the channel having at least one monolithic sorting structure configured to sort macromolecules from the sample fluid; forming a first set of vias in the second chip configured to couple the channel to the first reservoir, the first set of vias providing the sample fluid from the first reservoir to the monolithic sorting structure for sorting; forming a second set of vias in the second chip configured to couple the channel to the second reservoir; forming a third set of vias in the second chip configured to couple the channel to the third reservoir; forming a fourth set of vias in the first chip, the fourth set of vias having respective openings in a backside of the first chip and being configured as an inlet to the first reservoir; forming a fifth set of vias in the first chip, the fifth set of vias having respective openings in the backside of the first chip and being configured as an outlet for the second reservoir; and forming a sixth set of vias in the first chip, the sixth set of vias having respective openings in the backside of the first chip and being configured as an outlet for the third reservoir.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments may provide one or more of the following advantages:

reliable separation and sorting of macromolecules, suitable for relatively high volume processing;
reduced silicon area requirements through multi-tier stacked chip layers to drive down costs;
compatibility with advanced semiconductor processing;
sealing of microfluidic channels and reservoirs for improved manufacturability to provide air-tight, fluid-tight seals for the fluidic channels until needed for use;
access to fluidic through-silicon vias (TSVs) on the backside of the chip to facilitate the input and extraction of fluid; and
integration of electronics and fluidics.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

Figure 1A:
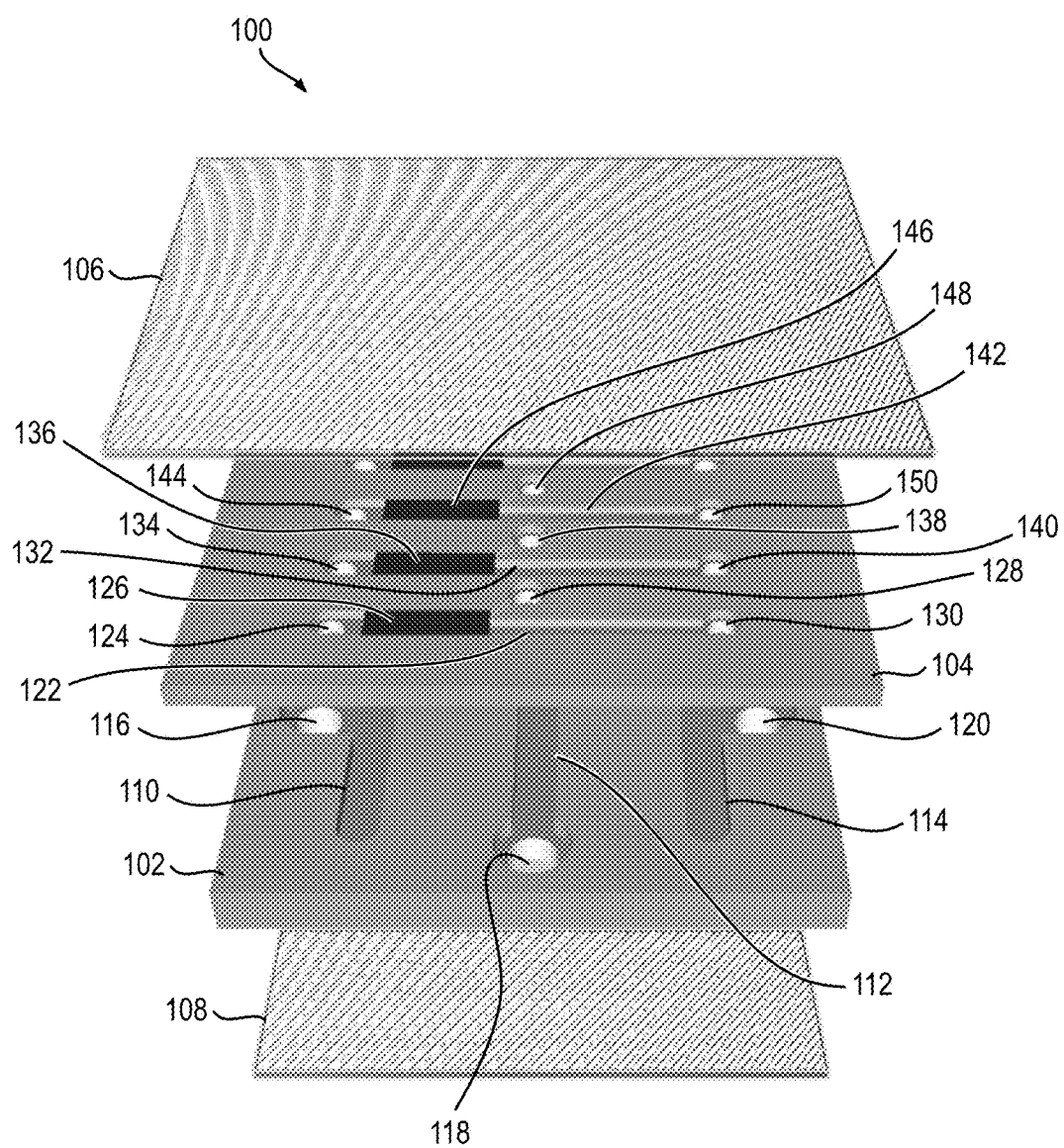
FIGS. 1A and 1B illustrate at least a portion of an exemplary microfluidic device, according to an embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of techniques for separating and/or sorting macromolecules for biomedical analytics using a silicon-based microfluidics device. It is to be appreciated, however, that the specific apparatus and/or methods illustratively shown and described herein are to be considered exemplary rather than limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

One or more embodiments of the invention layer individual silicon chips to form a three-dimensional (3D) stacked silicon microfluidics multi-chip device, where each chip (die or tier) is patterned with micro-fluidic or nano-fluidic features. The terms "chip," "die," and "tier" may be used interchangeably herein. The chips are bonded together and aligned with one another with lithographic precision. Oxide etch-stops and fluidic seals are created using wafer-to-wafer bonding and direct transfer bond layers, respectively, fully utilizing the manufacturability of a silicon process line. Each layer may provide a separate function.

In one or more embodiments comprising at least two chips or tiers, a first tier, which may be a bottom tier, comprises one or more reservoirs coupled by way of through-silicon vias (TSVs) to a second tier, which may be a top tier. A reservoir may hold sample fluid having an analyte in a buffer (e.g., water). The top tier includes one or more monolithic sorting structures for separating macromolecules from the sample fluid, where the macromolecules may have a size as small as 20 nanometers (nm) or less. In one or more embodiments, a monolithic sorting structure may comprise a deterministic lateral displacement (DLD) array having an array of pillars formed in a channel, where the DLD array separates out macromolecules of a certain size from the fluid. The sample fluid from the bottom tier is fed from one or more reservoirs to the sorting arrays, where the separated fluid and remaining fluid are fed to one or more reservoirs formed in the bottom tier. It is to be understood that use of the terms "top" and "bottom" when referring to separate chips or tiers in an embodiment refers to the relative (rather than absolute) orientation of one element with respect to another element as shown in the respective drawings, and is for convenience only.

By making use of bonded chips, and removing single chip in-plane restrictions, arrays of sorting pillars can be defined in a massively parallel arrangement to occupy most of the silicon surface of the top tier. Removing this restriction makes possible preparative silicon-based solutions for sorting volumes of biomaterial greater than one milliliter (mL) that would not be as economically viable with a single-chip approach. A novel bonding scheme is described so that embodiments of the invention may be realized without polymer piping to couple the separate chips, and the bonding scheme may be used for sealing very small nano-fluidic features.

Figure 1B:
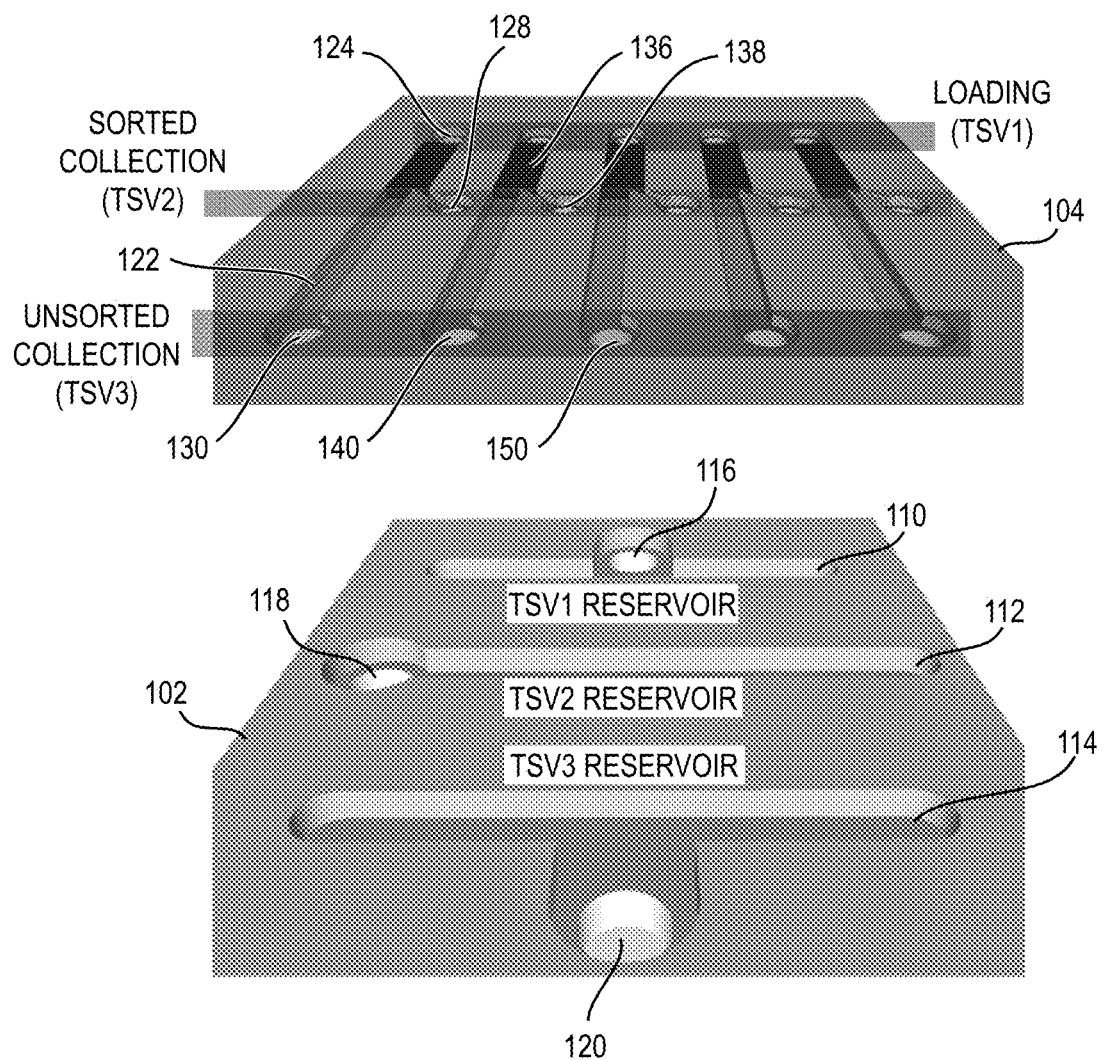

By way of example only and without limitation, FIGS. 1A and 1B illustrate an exemplary microfluidic device 100, according to an embodiment of the present invention. The microfluidic device 100, in this embodiment, includes a bottom tier 102, which may be referred herein as a fluidic interconnect layer, a top tier 104, which may be referred to herein as a functional layer, a top oxide seal 106, and a bottom oxide seal 108. The oxide seals 106 and 108 may comprise thermally grown silicon dioxide ($SiO_2$) layers, as described in further detail herein below. It should be appreciated that the illustration of FIG. 1A is not a perspective view of an embodiment, but rather shows four slices of an embodiment in a simplified manner so that various features of the illustrative embodiment may be more conveniently described; similarly for FIG. 1B.

In the particular embodiment illustrated in FIGS. 1A and 1B, the bottom tier 102 comprises three reservoirs: a first reservoir 110 for holding the sample fluid to be separated, a second reservoir 112 for receiving the separated fluid comprising the larger macromolecules filtered out by monolithic sorting structures in the top tier 104, and a third reservoir 114 for receiving the remaining fluid with smaller macromolecules after separation. A first TSV 116 provides an inlet to the first reservoir 110 so that the sample fluid may be distributed to parallel arrays in the top tier 104. A second TSV 118 provides an outlet for the second reservoir 112 so that the separated fluid may be removed, and a third TSV 120 provides an outlet for the third reservoir 114 so that the remaining fluid after separation may be removed. For storage or handling purposes, the bottom oxide seal 108 provides protection for openings to the TSVs 116, 118 and 120, but is removed (or partially removed to reveal the TSV openings) so that fluidic coupling may be made to the various TSVs. In practice, after the bottom oxide seal 108, or portions thereof, are removed to allow access to the TSVs, the TSVs may couple to various fluidic jigs or coupling components, but such components need not be illustrated to describe embodiments of the invention.

A bottom surface of the bottom tier 102 may be referred to as a backside of the bottom tier. Accordingly, the oxide seal 108 covers the backside of the bottom tier 102. Similarly, a top surface of the bottom tier 102 may be referred to as a front side of the bottom tier 102. Accordingly, the first, second, and third reservoirs are formed in the front side of the bottom tier 102.

The top tier 104 comprises three channels; a first channel 122 comprising a TSV 124, a DLD array 126, a TSV 128, and a TSV 130; a second channel 132 comprising a TSV 134, a DLD array 136, a TSV 138, and a TSV 140; and a third channel 142 comprising a TSV 144, a DLD array 146, a TSV 148, and a TSV 150. Although not explicitly illustrated as such in FIGS. 1A and 1B (but implied), in an embodiment the TSVs 124, 134, and 144 are each formed in the top tier 104 to couple their respective channels to the reservoir 110. In this way, with positive pressure applied to the TSV 116, sample fluid from the reservoir 110 is provided for analysis to the channels 122, 132, and 142. It is to be understood that the layout shown in FIGS. 1A and 1B is by way of illustration only and without limitation, as previously stated. For example, in one or more embodiments of the invention, the actual device structure may employ hundreds or thousands of parallel DLD arrays, as will become apparent to those skilled in the art given the teachings herein.

The bottom surface of the top tier 104 may be referred to as the backside of the top tier 104, and the top surface of the top tier 104 may be referred to as the front side of the top tier 104. Accordingly, the oxide seal 106 covers the front side of the top tier 104, where the channels 122, 132, and 142 are formed in the front side of the top tier 104.

The DLD arrays 126, 136, and 146 are each illustrated in FIG. 1A as solid blocks. This is done merely for convenience of illustration, but in one or more embodiments each DLD array comprises an array of pillars configured for sorting out macromolecules of a certain size or larger in the sample fluid. The macromolecules sorted (or separated) by the DLD array 126 are directed to flow to the TSV 128. Likewise, the macromolecules sorted (or separated) by the DLD arrays 136 and 146 are directed to flow to their respective TSVs 138 and 148.

Although not explicitly illustrated as such in FIG. 1A for ease of illustration, it is to be understood that the TSVs 128, 138, and 148 are each coupled to the reservoir 112 so that the separated fluid with the sorted molecules is provided to the reservoir 112 and available for extraction by way of the TSV 118. The remaining fluid, which may have smaller-sized macromolecules not sorted or separated by the DLD arrays, continues to flow in each of the channels and eventually flows to the TSVs 130, 140, and 150. Although not explicitly illustrated as such in FIG. 1A, the TSVs 130, 140, and 150 are each coupled to the reservoir 114 so that the reservoir 114 and the TSV 120 may receive the remaining fluid. The oxide seal 106 provides a sealing function for the nanofluidic features formed in the top tier 104, and in practice is not removed.

Each DLD array sorts out macromolecules of a prescribed size or larger based upon the dimensions and spacing of the pillars. In the particular embodiment illustrated in FIGS. 1A and 1B, each DLD array may have the same feature dimensions, so as to provide the same set of filtered macromolecule sizes to the reservoir 112. For some embodiments, one or more of the DLD arrays may be dimensioned to filter out various sized macromolecules. For some embodiments, differently dimensioned DLD arrays may feed into different reservoirs, so that various sized macromolecules may be filtered from the sample fluid simultaneously. For ease of illustration, only one reservoir (the reservoir 112) for collecting the separated fluid is shown, but from the preceding discussion it will become apparent to those skilled in the art given the teachings herein that other embodiments may employ multiple reservoirs for receiving separated fluid filtered through differently dimensioned DLD arrays.

The particular embodiment illustrated in FIGS. 1A and 1B comprises only two tiers or chips, but other embodiments may have more than two tiers stacked together into a single device for analyzing a sample fluid. For example, another tier stacked above the top tier 104 may include additional channels, each with a corresponding DLD array and TSVs coupled to their respective reservoirs in the bottom tier 102; or, another tier stacked above the top tier 104 or below the bottom tier 102 may include electronics for analyzing macromolecules separated from the sample fluid. Electronic circuits could also be integrated with the top or bottom tiers, for example to form an integrated sensor device.

Figure 2:
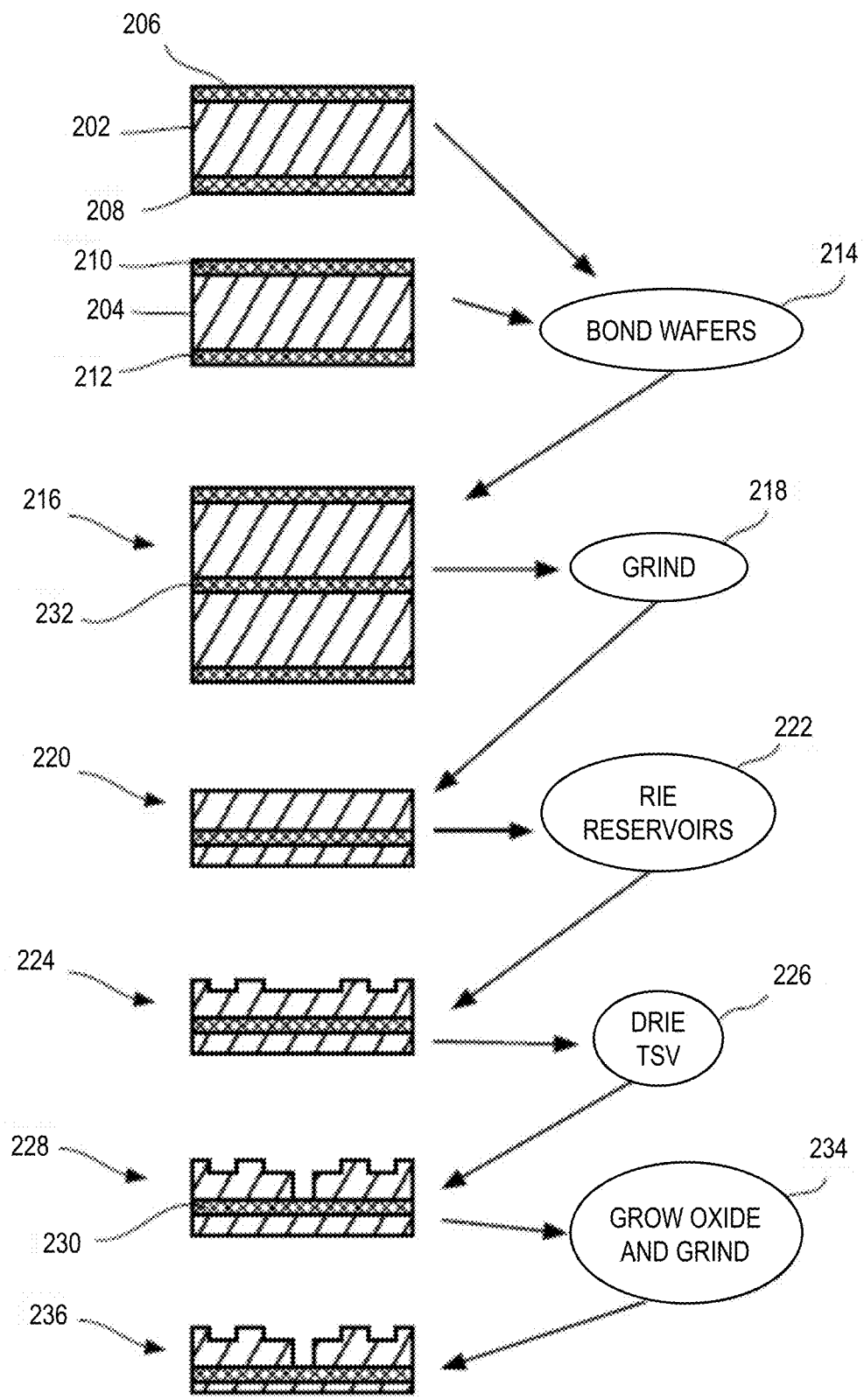
FIG. 2 illustrates an exemplary process flow for a bottom tier of a microfluidic device, according to an embodiment of the invention.

FIG. 2 illustrates a process flow for a bottom tier according to an embodiment. The description for FIG. 2 begins with Si wafers 202 and 204. The oxide layers 206 and 208 are thermally grown on the top and bottom surfaces of the wafer 202, and the oxide layers 210 and 212 are thermally grown on the top and bottom surfaces of the wafer 204. In step 214 the wafers 202 and 204 are oxide bonded together into a bonded structure 216. For some embodiments, the oxide layers may be thermally grown at 1000 C, for example to a thickness of about 1 µm for the oxide layer 212 and a thickness of about 0.2 µm for the oxide layer 206. For some embodiments, the silicon wafers 202 and 204 undergo megasonic cleaning with deionized water, dried with an IR lamp, and bonded together.

The process of direct oxide bonding depends on covalent bonds to hold the surfaces of the oxide/silicon together by van der Waals forces between the —OH groups. At room temperature the Si—OH (silanol) groups start to polymerize forming Si—O—Si and water. A further high temperature anneal between 800 C to 1000 C causes the oxide to flow at the interface, increasing contact area so that hydrogen molecules are diffused. The final result is a strongly bonded wafer with bond energies in excess of 2 mJ/cm$^2$. This strong bond enables further processing of the wafers, such as grinding and polishing, and helps ensure a stable oxide structure for fluid flow.

In step 218, the bonded structure 216 is ground on both top and bottom to provide the structure 220. In one embodiment, the wafer 216 is ground to a thickness of about 600 µm, and the wafer 204 is ground to a thickness of about 125 µm.

Resist masks and lithographic techniques are used to define reservoir patterns in the structure 220 (specifically, the top surface of the wafer 202 after grinding has been performed), where in the particular embodiment of FIG. 2, reactive ion etching (RIE), or an alternative etching methodology, is used to etch the reservoir patterns, indicated in step 222. The result is indicated by a structure 224.

Resist masks and lithographic techniques are used to define the TSVs in the structure 224. In step 226, DRIE (Deep RIE) is used to etch the TSVs to provide the structure 228. For some embodiments, the DRIE is the Bosch process, enabling deep silicon RIE down to a depth of 600 µm. In the example of FIG. 2, the oxide layer 230 in the structure 228 (which is the oxide layer 232 in the bonded structure 216) serves as an etch stop for the TSV. (In FIG. 2 only one TSV is illustrated in the structure 228, which represents some particular slice revealing a profile of one of the TSVs illustrated in the bottom tier 102 of FIG. 1A.) In some embodiments, the wafer 202 may include a deep buried oxide (DBOX) of about 2 µm to 4 µm in thickness and several hundred microns deep within the wafer 202 to serve as an etch stop for the TSVs and the oxide layer 230.

The wafer is then put through a resist strip and is thoroughly cleaned before thermal oxidation. The thermal oxide grows on all exposed surfaces of silicon, followed by additional grinding on that part of the wafer 204 remaining in the structure 228 (the bottom of the structure 228), as indicated in step 234, resulting in a structure 236. For some embodiments, the structure 228 is ground so that 30 µm of the wafer 204 remains in the structure 236.

Figure 3:
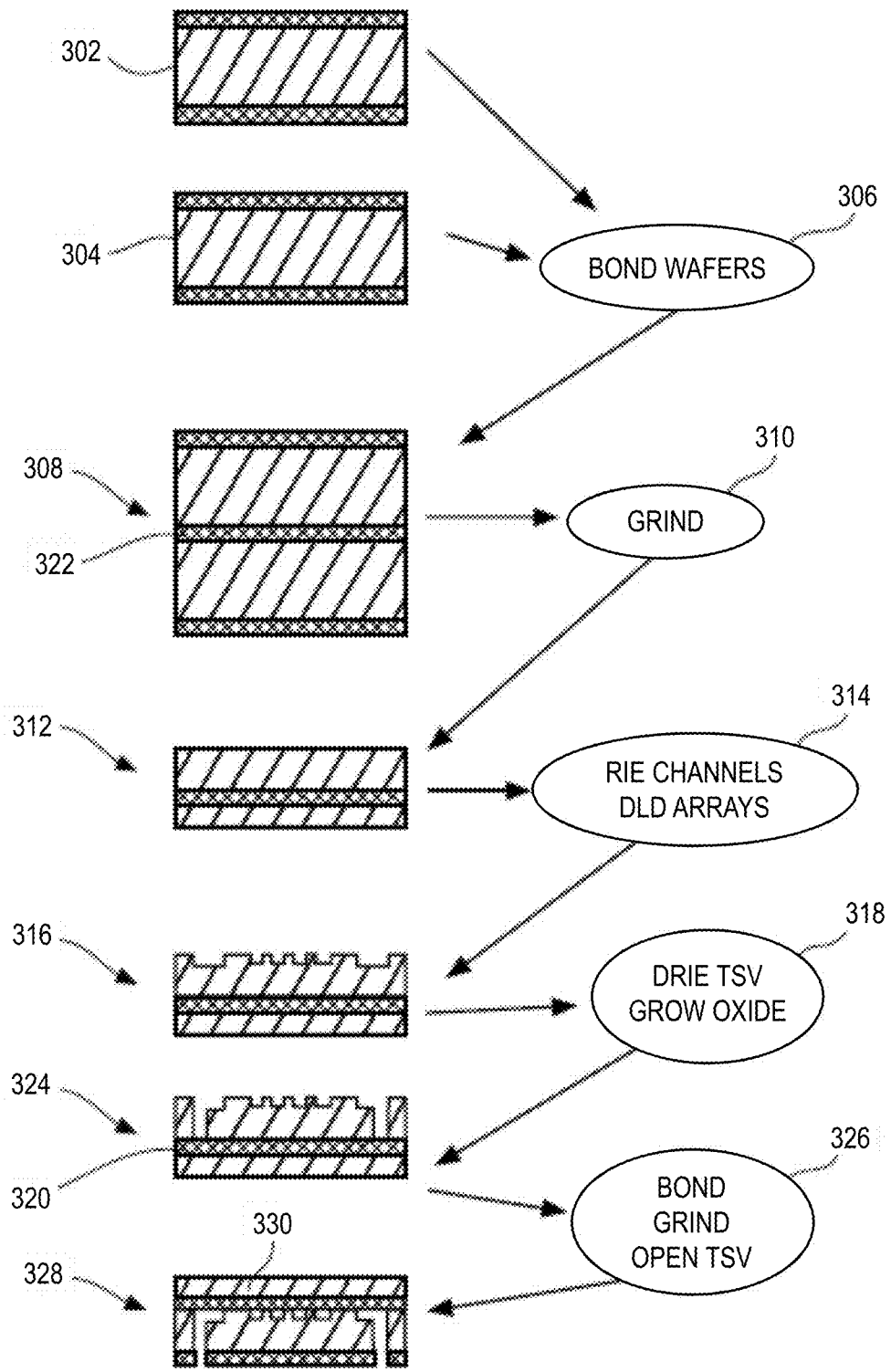
FIG. 3 illustrates an exemplary process flow for a top tier of a microfluidic device, according to an embodiment of the invention.

FIG. 3 illustrates a process flow for a top tier according to an embodiment. The steps in FIG. 3 are similar to that of FIG. 2. Two thermally oxidized Si wafers 302 and 304 are oxide bonded together as indicated in step 306, resulting in a structure 308. In step 310, the top surface of the wafer 302 is ground down, for example to about 600 µm, and the bottom surface of the wafer 304 is ground down, for example to about 125 µm, resulting in a structure 312. Resist masks and lithographic techniques are used to define channel and DLD array patterns in the top surface of the structure 312, where RIE is used to etch out the features as indicated in step 314, resulting in a structure 316. In step 318, TSVs are patterned into the silicon and DRIE is used to etch the TSVs down to the oxide layer 320, which is the oxide layer 322 of the structure 308. The DRIE process may be the Bosch process, where for example the TSVs are etched to a depth of about 600 µm, resulting in a structure 324. For ease of illustration, the particular slice of an embodiment represented by the structure 324 reveals only two TSVs. The step 318 also includes growing oxide on the structure 324 in preparation for bonding in a next step.

In step 326, a third thermally oxidized wafer is oxide bonded to the structure 324 as indicated by step 326, including grinding to thin the resulting structure and to open up the TSVs. For example, the top and bottom of the structure 324 after bonding the third wafer to its top may be thinned to about 30 µm, represented by a structure 328, where that part of the structure 328 labeled 330 is the remaining portion of the third wafer after grinding.

Figure 4:
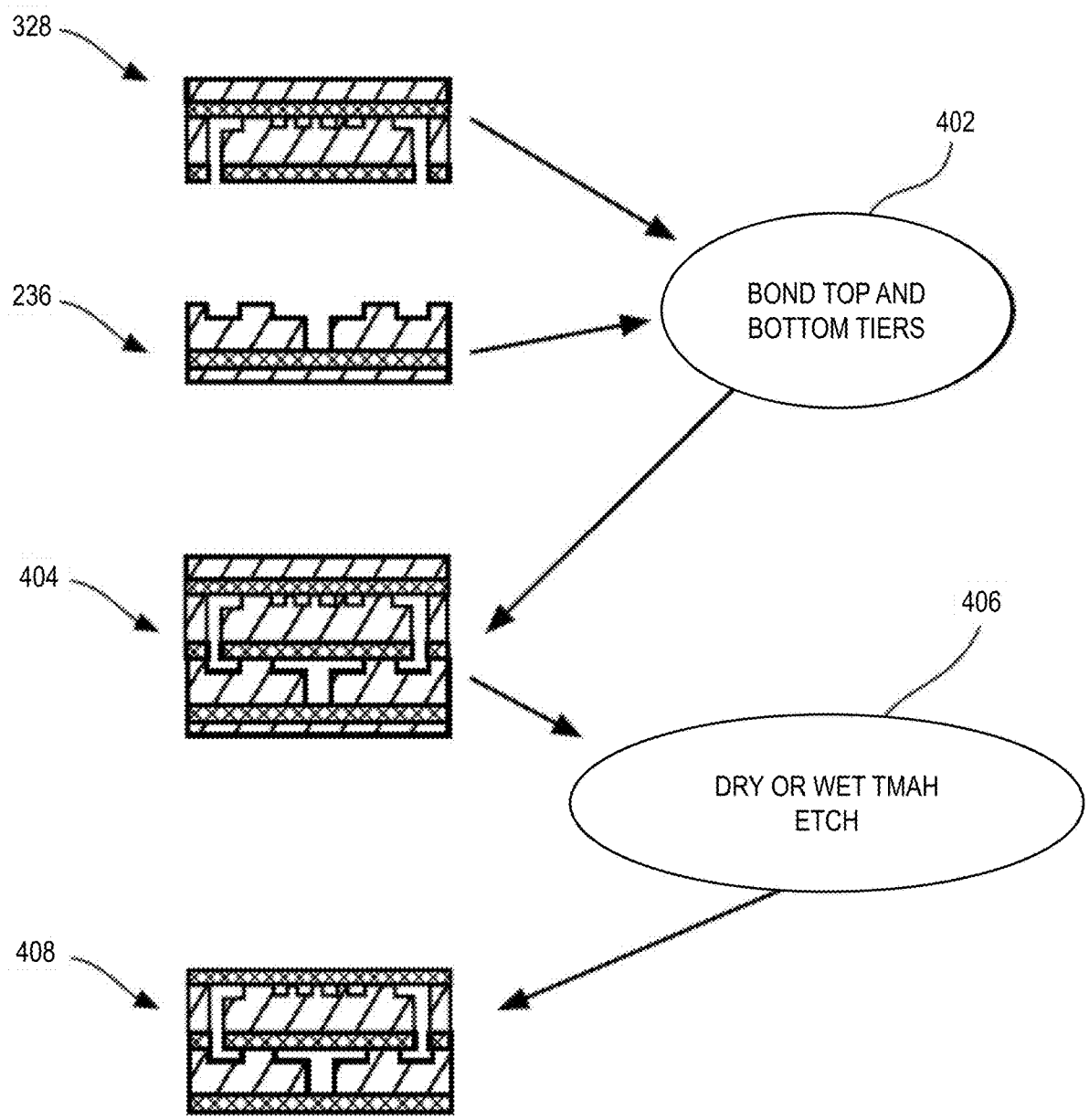
FIG. 4 illustrates an exemplary process flow for bonding together the top and bottom tiers to form a microfluidic device, according to an embodiment of the invention.

FIG. 4 illustrates a process flow for bonding together the top and bottom tiers to form a microfluidic device according to an embodiment. Starting with the structure 328 in FIG. 3 and the structure 236 from FIG. 2, as indicated in step 402 of FIG. 4 the structures 328 and 236 are oxide bonded together to form s structure 404. In step 406, the silicon on the top and bottom surfaces of the structure 404 are etched away using DRIE or a wet silicon etch method such as TMAH (Tetramethylammonium hydroxide) etching, resulting in a microfluidic device 408.

Clearly, the description of the fabrication methods with respect to the drawings do not include all process steps for semiconductor processing, but such process steps should be well known to one of ordinary skill in the art. For example, the various tiers or chips discussed with respect to the drawings may be wafers, whereas after processing and bonding, the resulting structure of bonded wafers is cut into chips. Accordingly, the microfluidic device 408 in FIG. 4 may represent a device at the wafer level, or a device after the bonded wafer structure has been diced into chips.

Furthermore, it is to be appreciated that the illustrations of the various structures formed by the process steps are simplified and do not show specific orientations of the TSVs with respect to the reservoirs and channels that they couple to. For example, the structure 328 of FIG. 3 shows two TSVs that in practice would couple into one or more channels, but for ease of illustration these TSVs are not shown to couple directly to the channels.

Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated by reference herein. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more embodiments of the invention.

An integrated circuit in accordance with aspects of the present disclosure can be employed in essentially any application and/or electronic system involving sensors that can detect and provide relevant environmental information, such as, but not limited to, radiation levels, inorganic particles, biological and/or chemical entities, etc. Suitable systems for implementing embodiments of the invention may include, but are not limited to, personal radiation dosimeters, biosensors, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An apparatus for sorting of macromolecules in a sample fluid, the apparatus comprising:
   a first chip having a front side and a backside, the first chip comprising at least first, second and third reservoirs formed in the front side of the first chip, the first reservoir being configured to hold the sample fluid;
   a second chip supported on the first chip, the second chip comprising a plurality of channels, each of the plurality of channels having at least one monolithic sorting structure configured to sort macromolecules from the sample fluid;
   a first set of vias formed in the second chip and configured to couple the plurality of channels to the first reservoir, the first set of vias providing the sample fluid from the first reservoir to the at least one monolithic sorting structure in each of the plurality of channels for sorting;
   a second set of vias formed in the second chip and configured to couple the plurality of channels to the second reservoir;
   a third set of vias formed in the second chip and configured to couple the plurality of channels to the third reservoir;

a fourth set of one or more vias formed in the first chip, the fourth set of one or more vias having respective openings in the backside of the first chip and being configured as an inlet to the first reservoir;

a fifth set of one or more vias formed in the first chip, the fifth set of one or more vias having respective openings in the backside of the first chip and being configured as an outlet for the second reservoir; and a sixth set of one or more vias formed in the first chip, the sixth set of one or more vias having respective openings in the backside of the first chip and being configured as an outlet for the third reservoir.

2. The apparatus of claim 1, wherein the at least one monolithic sorting structure comprises a deterministic lateral displacement (DLD) array configured to sort macromolecules from the sample fluid.

3. The apparatus of claim 1, wherein the second set of vias is configured to provide to the second reservoir macromolecules in the sample fluid greater than or equal to a prescribed dimension sorted by the at least one monolithic sorting structure.

4. The apparatus of claim 1, wherein the third set of vias is configured to provide to the third reservoir macromolecules in the sample fluid less than a prescribed dimension sorted by the at least one monolithic sorting structure.

5. The apparatus of claim 1, further comprising a first seal covering the backside of the first chip.

6. The apparatus of claim 5, wherein each of the first and second chips comprises silicon, and wherein the first seal comprises silicon dioxide.

7. The apparatus of claim 5, wherein the second chip has a front side and a backside, and wherein the plurality of channels is formed in the front side of the second chip, the apparatus further comprising a second seal covering the front side of the second chip.

8. The apparatus of claim 7, wherein each of the first and second chips comprises silicon, and wherein each of the first and second seals comprises silicon dioxide.

9. The apparatus of claim 1, wherein the second set of vias has a first opening in the backside of the first chip and a second opening in the first reservoir.

10. The apparatus of claim 1, wherein the second chip has a front side and a back side, and wherein the plurality of channels is formed in the front side of the second chip, the apparatus further comprising a first seal covering the front side of the second chip.

11. The apparatus of claim 10, wherein the first seal comprises silicon dioxide.

12. The apparatus of claim 1, wherein at least one of the first, second, third, fourth, fifth and sixth sets of one or more vias in the second chip or at least one of the one or more vias configured for communication with the first, second, and third reservoirs in the first chip comprises a through-silicon via.

13. An apparatus for sorting of macromolecules in a sample fluid, the apparatus comprising:

a first chip comprising a plurality of channels formed in a first side of the first chip and each of the plurality of channels having at least one monolithic sorting structure configured to sort macromolecules from the sample fluid;

a first set of vias formed in the first chip, the first set of vias having respective openings in a second side of the first chip opposite the first side, the sample fluid being provided to each of the plurality of channels through the first set of vias;

a second set of vias formed in the first chip, the second set of vias having respective openings in the second side of the first chip and being configured for receiving macromolecules in the sample fluid greater than or equal to a prescribed dimension sorted by the at least one monolithic sorting structure in each of the plurality of channels;

a third set of vias formed in the first chip, the third set of vias having respective openings in the second side of the first chip and being configured for receiving macromolecules in the sample fluid less than the prescribed dimension sorted by the at least one monolithic sorting structure in each of the plurality of channels; and first and second seals covering the first and second sides, respectively, of the first chip.

14. The apparatus of claim 13, further comprising a second chip, the second chip supporting the first chip and including at least first, second and third reservoirs formed in a front side of the second chip, the first reservoir being configured to hold the sample fluid, the first set of vias being configured to couple the first reservoir with the plurality of channels, the second set of vias being configured to provide to the second reservoir the macromolecules in the sample fluid greater than or equal to the prescribed dimension sorted by the at least one monolithic sorting structure in each of the plurality of channels, and the third set of vias being configured to provide to the third reservoir the macromolecules in the sample fluid less than the prescribed dimension sorted by the at least one monolithic sorting structure in each of the plurality of channels.

15. The apparatus of claim 14, further comprising:

one or more vias formed in the second chip, the one or more vias having respective openings in a backside of the second chip opposite the front side of the second chip and being configured to provide an inlet to the first reservoir;

one or more vias formed in the second chip, the one or more vias having respective openings in the backside of the second chip and being configured to provide an outlet for the second reservoir; and one or more vias formed in the second chip, the sixth set of one or more vias having respective openings in the backside of the second chip and being configured to provide an outlet for the third reservoir.

* * * * *